United States Patent
Ni et al.

(10) Patent No.: US 11,049,943 B2
(45) Date of Patent: Jun. 29, 2021

(54) METHOD FOR FORMING III-NITRIDE SEMICONDUCTOR DEVICE AND THE III-NITRIDE SEMICONDUCTOR DEVICE

(71) Applicant: Suzhou Han Hua Semiconductor Co.,Ltd, Suzhou (CN)

(72) Inventors: Xian-Feng Ni, Suzhou (CN); Qian Fan, Suzhou (CN); Wei He, Suzhou (CN)

(73) Assignee: SUZHOU HAN HUA SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 16/228,878

(22) Filed: Dec. 21, 2018

(65) Prior Publication Data

US 2020/0052076 A1     Feb. 13, 2020

(30) Foreign Application Priority Data

Oct. 31, 2018   (CN) .......................... 201811281410.2

(51) Int. Cl.
| | | |
|---|---|---|
| *H01L 29/20* | (2006.01) | |
| *H01L 21/311* | (2006.01) | |
| *H01L 29/66* | (2006.01) | |
| *H01L 29/778* | (2006.01) | |

(52) U.S. Cl.
CPC .... *H01L 29/2003* (2013.01); *H01L 21/31144* (2013.01); *H01L 29/66462* (2013.01); *H01L 29/778* (2013.01)

(58) Field of Classification Search
CPC ...................................................... H01L 29/20
See application file for complete search history.

(56) References Cited

U.S. PATENT DOCUMENTS

| | | | |
|---|---|---|---|
| 9,337,278 B1* | 5/2016 | Gu ....................... | H01L 29/2003 |
| 2017/0133239 A1 | 5/2017 | Gu et al. | |
| 2018/0209038 A1* | 7/2018 | Okahisa ............ | H01L 21/76254 |

FOREIGN PATENT DOCUMENTS

| | | |
|---|---|---|
| CN | 102315347 A | 1/2012 |
| CN | 106910675 A | 6/2017 |

OTHER PUBLICATIONS

Office Action dated Apr. 28, 2019, issued in counterpart CN Application No. 201811281410.2, with English Translation. (10 pages).
Office Action dated May 13, 2019, issued in counterpart CN Application No. 201811281410.2, with English Translation. (11 pages).
Office Action dated Jun. 17, 2019, issued in counterpart CN Application No. 201811281410.2, with English Translation. (11 pages).

* cited by examiner

*Primary Examiner* — Marvin Payen
(74) *Attorney, Agent, or Firm* — Westerman, Hattori, Daniels & Adrian, LLP

(57) ABSTRACT

The present disclosure includes but is not limited to the III-Nitride semiconductor devices including a barrier layer, a gallium nitride or indium gallium nitride channel layer having a Ga-face coupled with the barrier layer, and a patterned thermoconductive layer having a thermal conductivity of at least 500 W/(m-K) within 1000 nanometers of a Ga-face of the gallium nitride channel layer. The semiconductor device may be a high-electron-mobility transistor or a semiconductor wafer. Methods for making the same also are described.

9 Claims, 4 Drawing Sheets

METHOD FOR FORMING III-NITRIDE SEMICONDUCTOR DEVICE AND THE III-NITRIDE SEMICONDUCTOR DEVICE

TECHNICAL FIELD OF THE INVENTION

Embodiments of the present disclosure relate generally to Group III-nitride (GaN, AlN, InN, ScN, BN and/or their alloys) semiconductor devices and methods, and more particularly to III-Nitride on high thermal conductivity material high electron mobility transistors (HEMTs).

BACKGROUND OF THE INVENTION

In the current state of III-Nitride semiconductor devices, the standard approach toward making electronic devices such as HEMTs, on a high thermal conductivity substrate (e.g., with thermal conductivity higher than silicon carbide (SiC)) has multiple limitations. The standard approach typically starts with an III-Nitride device structure with metal polarity (like Ga-Polar for GaN or Al-Polar for AlN) grown on Si-face SiC or a Si (111) substrate that is then flip-chip surface mounted to a carrier wafer. The SiC or Si substrate and part of a GaN buffer layer is then mechanically or chemically removed and replaced by a high thermal conductivity substrate such as diamond. An alternative approach has been disclosed to start with an III-Nitride device structure with N polarity grown on C-face SiC or a Si (111) substrate. A high thermal conductivity substrate such as diamond is mounted on the top and then the SiC or Si substrate and part of a GaN buffer layer is then mechanically or chemically removed. In either approach, it would require to grow or bond a high thermal conductive substrate (like Diamond) to the III Nitride. The large lattice and especially thermal expansion mismatch between the high thermal conductive substrate and III Nitride will cause large strain in between III Nitride and high thermal conductive substrate With the wafer size increase, the strain will increase accordingly and cause large wafer bow or even wafer crack, thus make the large wafer size, III Nitride on high thermal conductive substrate difficult or impossible to manufacture.

SUMMARY OF THE INVENTION

One embodiment is a method for fabricating an III-Nitride semiconductor device. The embodiment includes but not limited to the following steps: (1) provides a substrate, (2) forms a nucleation layer on the substrate, (3) forms a back barrier layer on the nucleation layer, (4) forms a patterned dielectric layer on the back barrier layer, and (5) forms a patterned thermoconductive layer on the patterned dielectric layer. In this embodiment, the pattern of the thermoconductive layer is the same as the pattern of the patterned dielectric layer, and the back barrier layer is formed of Group III-Nitride material.

One relative embodiment forms a dielectric layer on the back barrier layer and then uses photoresist and masked lithography to pattern the dielectric layer for forming the patterned dielectric layer with a predetermined pattern.

One relative embodiment is that the dielectric layer is formed by one or more materials selected from the group consisting of SiN, AlN and SiO2.

One relative embodiment is that the dielectric layer has a thickness range from 1 nanometer to 100 nanometer.

One relative embodiment comprises the following steps: (1) forms a high thermal conductive seedling layer over the patterned dielectric layer, and changes the high thermal conductive seedling layer into the patterned thermoconductive layer.

One relative embodiment comprises one of the following: (1) micronized grinds the patterned dielectric layer to form the patterned high conductive seeding layer, (2) processes a powder suspension pretreatment over the patterned dielectric layer to form the patterned high conductive seeding layer, and (3) uses a diamond seedling layer as the high thermal conductive seedling layer and controls the diamond growth conditions so that a diamond layer only glows on the diamond seedling layer and a patterned thermal conductive layer formed of diamond is formed.

One relative embodiment comprises at least one of the following: (1) the patterned thermoconductive layer has a thermal conductivity of at least 500 W/(m-k), (2) the patterned thermoconductive layer is formed of diamond, boron nitride, or cubic boron arsenide, (3) the patterned thermoconductive layer is composed of a hatched pattern, and (4) the patterned thermoconductive layer has a pattern corresponding to the positions of one or more devices generating heat, wherein the one or more devices are formed over the patterned thermoconductive layer.

One relative embodiment comprises forming the back barrier layer by using at least one of the following: (1) an aluminum gallium nitride alloyed layer with aluminum composition from 1 to 100%, (2) an indium gallium aluminum nitride alloyed layer with Indium composition from 1 to 100%, (3) a boron gallium nitride alloyed layer with Boron composition from 1 to 100%, and (4) a scandium gallium aluminum nitride alloyed layer with Scandium composition from 1 to 100%.

One relative embodiment comprises the following steps: (1) flips the combination of the substrate, the nucleation layer, the back barrier layer, the patterned dielectric layer and the patterned thermoconductive layer, (2) removes the substrate, (3) removes the nucleation layer, and (4) removes part of the back barrier layer.

One relative embodiment comprises the following steps: (1) forms a channel layer on the residual back barrier layer, (2) forms a barrier layer on the channel layer, and (3) forms an activation layer over the residual back barrier layer.

One relative embodiment comprises at least one of the following: (1) the channel layer is formed of one or more materials selected from the group consisting of GaN, InGaN, and AlGaN, and (2) the barrier layer is formed of one or more materials selected from the group consisting of AlGaN, InGaN, and ScAlN.

One relative embodiment comprises keeping the patterned thermoconductive layer with a distance of 5 to 1000 nanometers from the interface between the channel layer and the barrier layer.

One relative embodiment comprises at least one of the following: (1) forms a cap layer on the barrier layer, wherein the cap layer is formed of one or more materials selected from the group consisting of GaN and SiN, and (2) forms a carrier mounting layer on the patterned thermoconductive layer, wherein the carrier mounting layer and the patterned dielectric layer are positioned on two opposite sides of the patterned thermoconductive layer.

One embodiment is an III-Nitride semiconductor device. In the device, a patterned dielectric layer is positioned on a patterned thermoconductive layer; and a back barrier layer is positioned on the patterned dielectric layer. In the device, the pattern of the thermoconductive layer is the same as the pattern of the patterned dielectric layer, and the back barrier layer is formed of Group III-Nitride material.

One relative embodiment comprises at least one of the following: (1) the dielectric layer is formed of one or more materials selected from the group consisting of SiN, AlN and SiO2, and (2) the dielectric layer has a thickness range from 1 nanometer to 100 nanometer.

One relative embodiment comprises at least one of the following: (1) the patterned thermoconductive layer has a thermal conductivity of at least 500 W/(m-k), (2) the patterned thermoconductive layer is formed of diamond, boron nitride, or cubic boron arsenide, (3) the patterned thermoconductive layer is composed of a hatched pattern, and (4) the patterned thermoconductive layer has a pattern corresponding to the positions of one or more devices generating heat, wherein the one or more devices are formed over the patterned thermoconductive layer.

One relative embodiment is that the back barrier layer is a residual back barrier layer formed by removing part of a complete back barrier layer positioned on the patterned dielectric layer.

One relative embodiment is that the back barrier layer (or viewed as the residual back barrier layer) is formed by one or more materials selected from a group consisting of the following: an aluminum gallium nitride alloyed layer with aluminum composition from 1 to 100%, an indium gallium aluminum nitride alloyed layer with Indium composition from 1 to 100%, a boron gallium nitride alloyed layer with Boron composition from 1 to 100%, and a scandium gallium aluminum nitride alloyed layer with Scandium composition from 1 to 100%.

One relative embodiment comprise a channel layer positioned on the back barrier layer, a barrier layer positioned on the channel layer, and an activation layer positioned over the back barrier layer.

One relative embodiment comprises at least one of the following: (1) the channel layer is formed of one or more materials selected from the group consisting of GaN, InGaN, and AlGaN, and (2) the barrier layer is formed of one or more materials selected from the group consisting of AlGaN, InGaN, and ScAlN.

One relative embodiment is that the patterned thermoconductive layer is with a distance of 5 to 1000 nanometers from the interface between the channel layer and the barrier layer.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

BRIEF DESCRIPTION OF THE PREFERRED EMBODIMENTS

Figure 1:
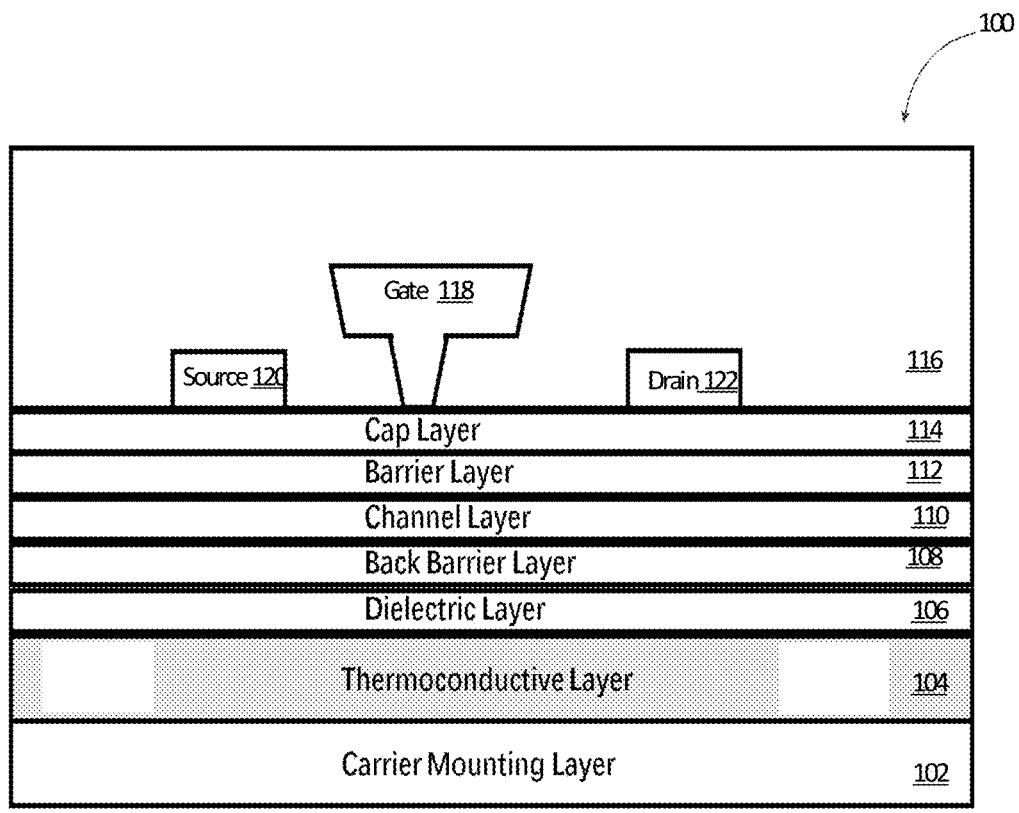
FIG. 1 illustrates a cross-sectional view of a semiconductor device in accordance with various embodiments.

Embodiments of the present disclosure describe III nitride (GaN, AlN, InN, ScN, BN and/or their alloys) semiconductor devices and methods, and more particularly III Nitride on high thermal conductivity material high electron mobility transistors (HEMTs). In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment." "in embodiments," "in some embodiments, or "in various embodiments, which may each refer to one or more of the same or different embodiments. Furthermore, the terms "comprising." "including." "having and the like, as used with respect to embodiments of the present invention, are synonymous.

The phrase "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

The phrase "formed on", along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer.

Usage of terms like "top" and "bottom" are to assist in understanding, and they are not to be construed to be limiting on the disclosure.

The term "active surface" as used herein may refer to the Surface of a die having the active regions/areas, as is known to those having skill in the art. The active surface of a die may include any one or more of various circuitry components, Such as transistors, memory cells, passive components, and the like.

For the purposes of the present invention, the phrases "A or B' and "A and/or B' mean (A), (B), or (A and B).

A cross-sectional side view of an example semiconductor device 100 is illustrated in FIG. 1. As illustrated, the semiconductor device 100 (also referred to as "device 100') may include a metal-face (like Ga-Polar for GaN or Al-Polar for AlN) wafer stack including a carrier mounting layer 102, a patterned thermoconductive layer 104, a dielectric layer 106, a back barrier layer 108 that may be a metal-face aluminum gallium nitride (AlGaN) alloyed layer with aluminum composition from 1 to 100%, a metal-face indium gallium aluminum nitride (InGaAlN) alloyed layer with indium composition from 1 to 100%, a metal-face boron gallium nitride (BGaN) alloyed layer with boron composition from 1 to 100%, or a metal-face scandium gallium aluminum nitride (ScGaAlN) alloyed layer with scandium composition from 1 to 100%. The dielectric layer 106 may be one layer of SiN, AlN, SiO2, or combination of two or more of these layers, and may have a thickness range from 1 nanometer to 100 nanometer. In various embodiments, a Metal-face III-Nitride channel layer 110, a barrier layer 112, and a Metal-face cap layer 114. In embodiments, the channel layer 110 may be one layer of GaN, InGaN, AlGaN, or combination of two or more of these layers. The barrier layer 112 may be one layer of AlGaN, InGaN, ScAlN, or combination of two or more of these layers. An activation layer 116 may be formed on the Ga-face GaN cap layer 114 in various embodiments and include a material such as silicon nitride (SiN). In embodiments, Metal-face layers of the Metal-face wafer Stack may have a Metal-face that faces away from the carrier mounting layer 102 toward the activation layer 116. The activation layer 116 may include a gate 118, a source 120, and a drain 122 in various embodiments. In embodiments, a two dimensional electron gas (2DEG) region may be formed at an interface of the Ga-face GaN channel layer 110 and the barrier layer 112 from polarization and piezoelectric strain effects between these layers. The thermoconductive layer 104 may be within a distance of 5 to 1000 nanometers (nm) from the 2DEG region in various embodiments. In various embodiments, one or more of the layers, such as the carrier mounting layer 102 or the Ga-face GaN cap layer 114 may not be present. In embodiments, the thermoconductive layer 104 has a thermal conductivity, k value, of at least 500 watts per meter kelvin (W/(m-K)). The thermoconductive layer 104 may be a patterned layer formed of diamond, boron nitride, or cubic boron arsenide in various embodiments. The carrier mounting layer 102 may have a similar thermal conductivity and composition as the thermoconductive layer 104 in various embodiments. In embodiments, the device 100 includes an activation layer that is used in a high-electron-mobility transistor (HEMT). In other embodiments, differing types of activation layers for other device types may be used. In embodiments, an activation layer may not be present, with the device 100 being a multilayer wafer semiconductor component for use in later fabrication processes.

Figure 2:
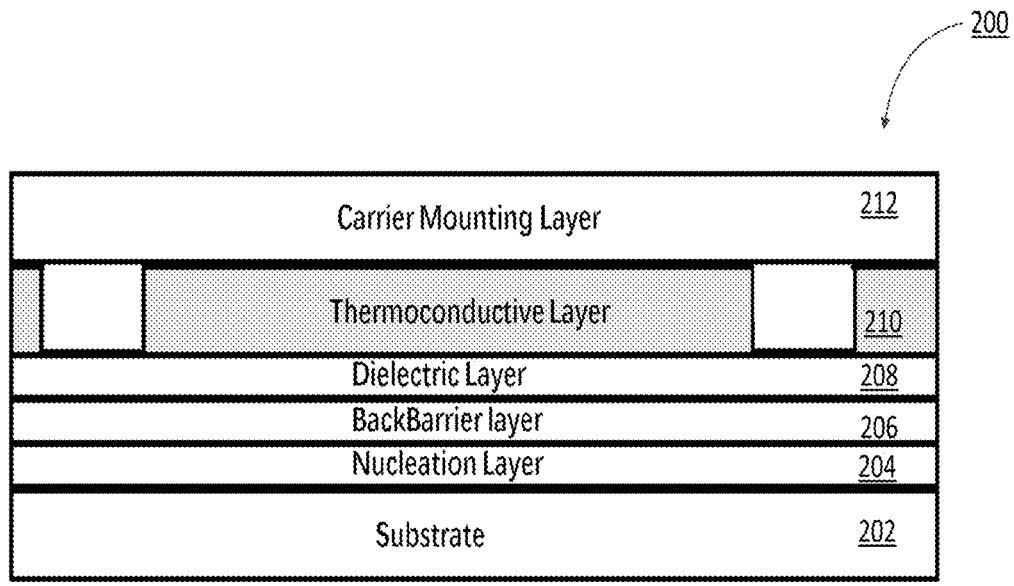
FIG. 2 illustrates a cross-sectional view of a multilayer wafer formed in accordance with various embodiments.

FIG. 2 illustrates a cross-sectional view of an N-face wafer stack 200 in accordance with various embodiments. The N-face wafer stack 200 may include a substrate 202, an N-face nucleation layer 204, an N-face III-Nitride back barrier layer 206, a dielectric layer 208, a patterned thermoconductive layer 210, and a carrier mounting layer 212. In embodiments, the back barrier layer 206 may include one layer of AlGaN, InGaN, ScAlN, or combination of two or more of these layers. In embodiments, N-face layers of the N-face wafer stack 200 may have an N-face that faces away from the substrate 202.

In embodiments, the substrate 202 may be a C-face silicon carbide (SiC) substrate, but other materials such as N-face GaN, N-face AlN, silicon, or sapphire may also be used. The dielectric layer 208 may range in thickness from approximately 1 nm to 100 nm in various embodiments and may be formed of a material such as SiN or AlN.

Figure 3:
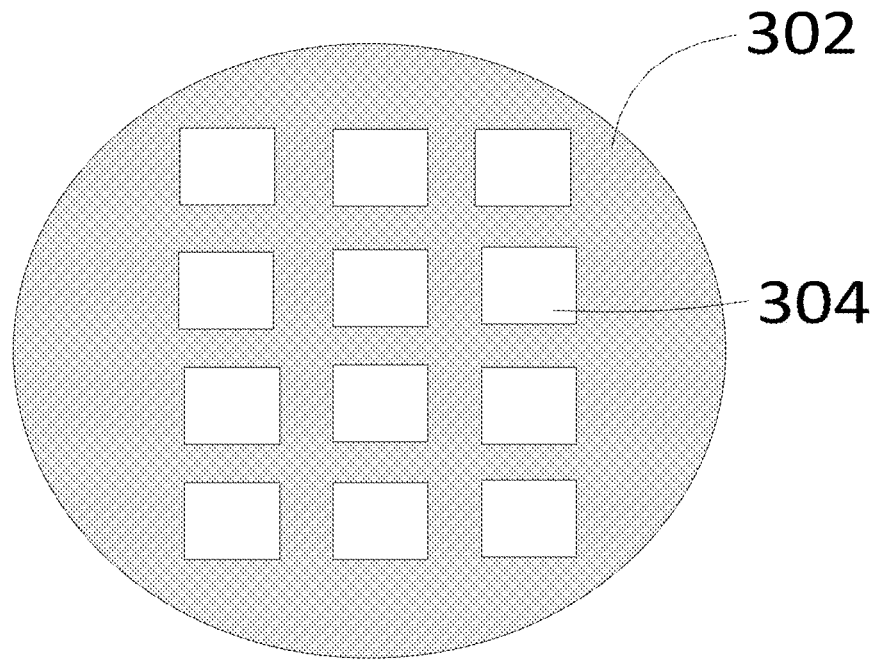
FIG. 3 illustrates a bottom view of a multilayer wafer formed in accordance with various embodiments.

FIG. 3 illustrates a bottom view of the N-face wafer stack 200 in accordance with various embodiments. In the present embodiment, the thermoconductive layer 302 is composed of a hatched pattern, and the inside of the box indicates regions 304 not covered by the thermoconductive layer. The thermoconductive layer 302 can cover only a portion of the III nitride devices and/or microwave integrated circuit in which the device generates a large amount of heat (a high power amplifier and/or other locations where the heat generating device is located), and can provide a better heat dissipation effect. In other embodiments, the thermoconductive layer 302 can be composed of other patterns. It can be understood that the shape and size of the thermoconductive layer 302 pattern can be selected according to actual conditions. It should be noted that, in FIG. 3 only the area covered by the thermoconductive layer 302 is schematically shown. In actual production, the pattern of the area covered by the thermoconductive layer 302 is more complicated. It can be understood that this does not hinder the technical staff of the user understanding of the program.

Figure 4:
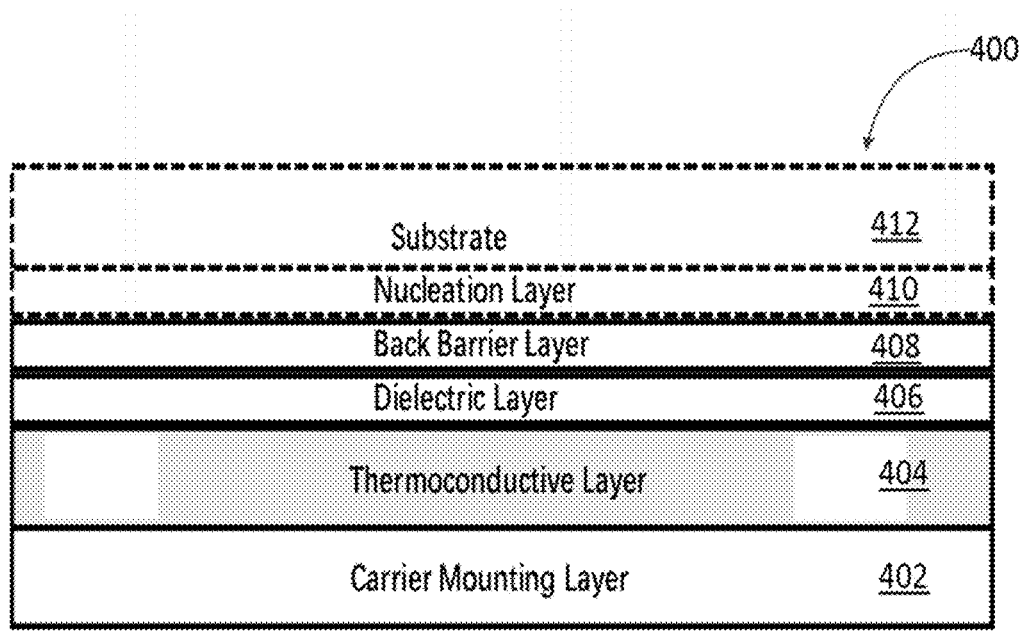
FIG. 4 illustrates a cross-sectional view of a multilayer wafer formed in accordance with various embodiments.

FIG. 4 illustrates a cross-sectional view of a Metal-face wafer stack 400 in accordance with various embodiments. The Metal face wafer stack 400 may be a flipped N-face wafer stack 200 as described with respect to FIG. 2, in various embodiments. As shown, the Ga-face wafer stack 400 includes a substrate 412, a nucleation layer 410, a Metal-face back barrier 408, a dielectric layer 406, a patterned thermoconductive layer 404, and a carrier mounting layer 402. In embodiments, Metal-face layers of the Metal-face wafer stack 400 may have a Metal-face that faces toward the substrate 412. After removal of the substrate 412, and the nucleation layer 410, a Metal-face III-N wafer stack 414 remains. The Metal-face III-N wafer stack 414 may include a carrier mounting layer 402, a patterned thermoconductive layer 404, dielectric layer 406, and back barrier layer 408 that may include one layer of Metal-face AlGaN, InGaN, ScAlN, or combination of two or more of these layers in various embodiments. In embodiments, Metal-face layers of the Metal-face III-Nitride wafer stack 414 may have a Metal-face that faces away from the carrier mounting layer 402. In embodiments, layers 402, 404, 406, 408, 410, and 412 of the wafer stack 400 may correspond to layers 212, 210, 208, 206, 204, and 202, respectively, of the wafer stack 200, as illustrated in FIG. 2.

Figure 5:
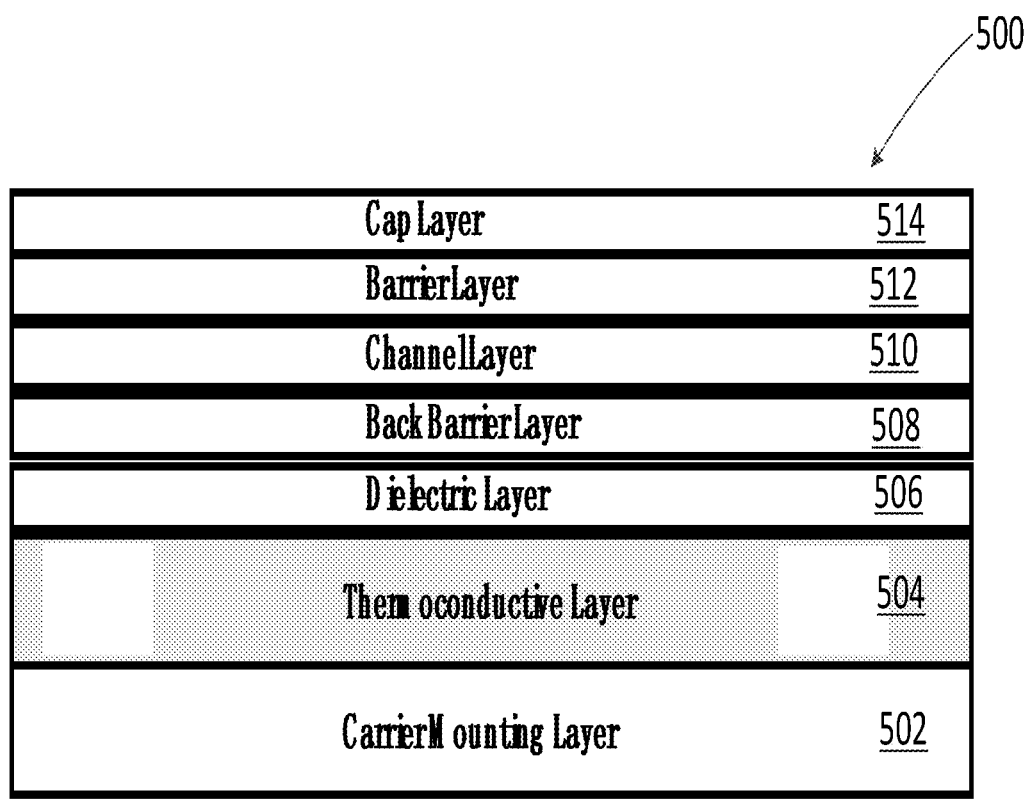
FIG. 5 illustrates a cross-sectional view of a multilayer wafer formed in accordance with various embodiments.

FIG. 5 illustrates a cross-sectional view of a Metal-face wafer stack 500 in accordance with various embodiments. The Metal face wafer stack 500 may be the Metal face wafer stack 414, with an additional of a channel layer 510, a barrier layer 512 and cap layer 514. In embodiments, the channel layer 510 may be one layer of GaN, InGaN, AlGaN, or combination of two or more of these layers. The barrier layer 512 may be one layer of AlGaN, InGaN, ScAlN, or combination of two or more of these layers. In embodiments, layers 502, 504, 506, and 508 of the wafer stack 500 may correspond to layers 402, 404, 406, and 408, respectively, of the wafer stack 400. In embodiments, the Metal-face III-Nitride wafer stack 500 corresponds to the portion of the device 100 below the activation layer 116 as shown in FIG. 1, with layers 102, 104, 106, 108, 110, 112, and 114 corresponding to layers 502, 504, 506, 508, 510, 512, and 514, respectively. Accordingly, their characteristics and whether a given layer may not be present in some embodiments will not be further described as these matters have been discussed with respect to FIG. 1.

Figure 6:
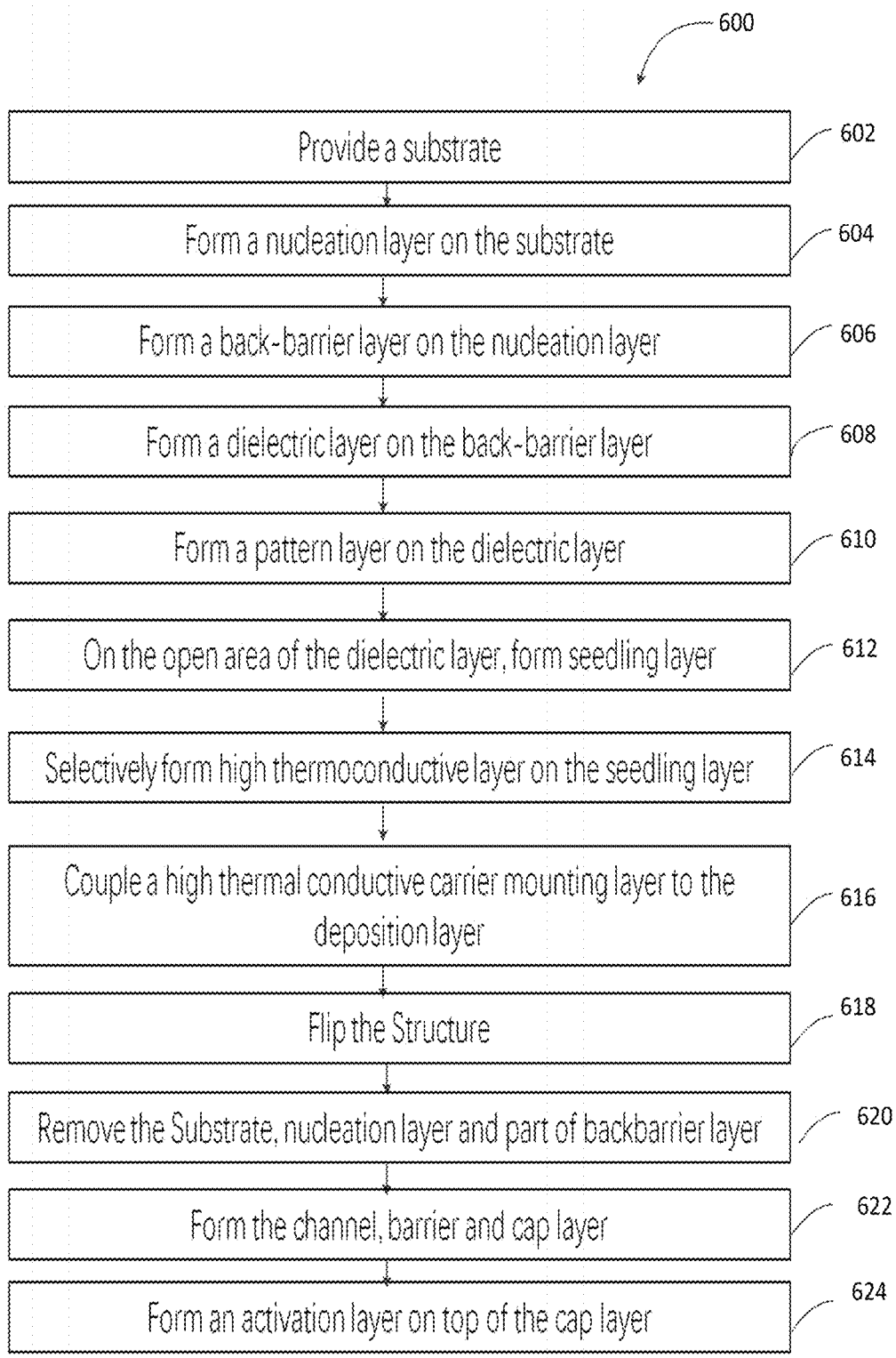
FIG. 6 is a flow diagram of a method for fabricating a semiconductor device in accordance with various embodiments.

FIG. 6 illustrates a flow diagram of a method 600 for fabricating a semiconductor device such as the device 100 in accordance with various embodiments. In embodiments, various layers may be formed or grown, such as by using molecular beam epitaxy (MBE), plasma enhanced chemical vapor deposition (PECVD), or metal organic chemical vapor deposition (MOCVD), for example. In embodiments, some layers may be coupled with other layers using other methods, such as a wafer transfer process or a wafer bonding process, for example. Generally, in embodiments, an N-face III-Nitride structure may be used as a starting material with a patterned, high thermal conductivity material deposited to a front side of the epitaxial structure. In embodiments, the patterned form of the high thermal conductive material will significantly reduce the strain between the high thermal conductive layer and III-Nitride structure, caused by lattice and thermal expansion mismatch. This approach can thus enable large wafer size III-Nitride on high thermal conductive layer with significantly reduced wafer bow, avoid forming the crack due to the strain, and significantly improve the manufacturability of large wafer size III-Nitride on high thermal conductive layer material and devices.

At a block 602, a substrate, such as substrate 202 or 412 may be provided. In embodiments, the substrate may be C-face SiC, N-face GaN, N-face AlN, silicon, sapphire, or another substrate. At operation 604, an N-face nucleation layer, such as the N-face nucleation layer 204 or 410, may be formed on the substrate. At a block 606, an N-face III-Nitride back barrier layer, such as the N-face III-Nitride back barrier layer 206, 408 or 508 may be formed on the N-face nucleation layer. At operation 608, a dielectric layer, such as the dielectric layer 208, 406 or 506, may be formed on the N-face back barrier layer. At a block 610, a predetermined pattern can be formed using photoresist and masked lithography. Open areas, such as 302 are formed and residual area, such as 304, is covered by residual photoresist. At operation 612, a high thermal conductive seedling layer, such as diamond seedling layer, may be grown by diamond micronized grinding of the patterned dielectric layer formed in block 610, or diamond powder suspension pretreatment on the patterned dielectric layer formed in block 610. The diamond seedling layer may be of different shapes and sizes in different embodiments. At a block 614, on the patterned diamond seedling layer form in operation 612, the diamond growth conditions (including but not limited to methane concentration, growth pressure) can be controlled so that a diamond layer only grows on the diamond seedling layer. Thereby, the patterned diamond seedling layer is changed into the patterned diamond layer, with a thickness in the range from 0.1 to 500 μm. At operation 616, high thermal conductivity carrier mounting layer, such as the carrier mounting layer 212, 402 or 502, may be coupled with the high thermal conductivity layer. In embodiments, the high thermal conductivity layer may have a thickness such as approximately 50 um (or greater) such that the carrier mounting layer is not used. At a block 618, the wafer structure formed by the preceding operations may be flipped. In embodiments, the high thermal conductivity carrier mounting layer is now the substrate, with the overlying Metal face III-Nitride material having Metal face polarity facing upward. At operation 620, The substrate, nucleation layer and part of the back barrier may be removed by laser lift-off, substrate polishing, dry etching, wet etching, or a combination of multiple methods mentioned above. Thus, a residual back barrier layer is left. At a block 622, channel layer as such as 510, barrier layer such as 512, and a cap layer such as 514 is formed on the wafer structure formed by the preceding operations, or viewed as formed on or over the back barrier layer, even the residual back barrier layer. It may include growth of an epitaxial layer stack using a growth technique such as MBE or MOCVD, or it may include a wafer transferring technology or a wafer bonding technology. At operation 624, an activation layer, such as the activation layer 116, may be formed on the cap layer.

As discussed with respect to FIG. 2, one or more of the layers of the process 600 may not be formed in various embodiments, such as the carrier mounting layer, or the cap layer, for example. Accordingly, one or more of the operations of the process 600 may not be performed, such as forming the carrier mounting layer in operation 616.

Those skilled in the art will recognize that the device, such as 100, is given by way of example and that, for simplicity and clarity, only so much of the construction and operation of the device 100 as is necessary for an understanding of the embodiments is shown and described. Various embodiments contemplate any suitable component or combination of components performing any suitable tasks in association with device 100, according to particular needs. Moreover, it is understood that the device 100 should not be construed to limit the types of devices in which embodiments may be implemented.

Although the invention has been illustrated and described with respect to several preferred embodiments thereof, various changes, omissions and additions to the form and detail thereof, may be made therein, without departing from the spirit and scope of the invention. Modifications and changes may be made within the scope of the invention, which is defined by the appended claims.

What is claimed is:

1. A III-Nitride semiconductor device, comprising:
   a patterned dielectric layer positioned on a patterned thermoconductive layer; and
   a back barrier layer positioned on the patterned dielectric layer;
   a patterned seedling layer between the patterned dielectric layer and the patterned thermoconductive layer;
   wherein the patterned thermoconductive layer has a same pattern as the patterned dielectric layer, and the back barrier layer is formed of Group III-Nitride material; and
      the seedling layer has a pattern corresponding to positions of one or more devices generating heat, the patterned thermoconductive layer is formed on the pattern, and the one or more devices are formed over the patterned thermoconductive layer.

2. The semiconductor device of claim 1, further comprising at least one of the following:
   the dielectric layer being formed of one or more materials selected from the group consisting of SiN, AlN and $SiO_2$; and
   the dielectric layer having a thickness range from 1 nanometer to 100 nanometer.

3. The semiconductor device of claim 1, further comprising at least one of the following:
   the patterned thermoconductive layer having a thermal conductivity of at least 500 W/(m-k);
   the patterned thermoconductive layer being formed of diamond, boron nitride, or cubic boron arsenide;
   the patterned thermoconductive layer being composed of a hatched pattern;
   the patterned thermoconductive layer having a pattern corresponding to the positions of one or more devices generating heat, wherein the one or more devices are formed over the patterned thermoconductive layer.

4. The semiconductor device of claim 1, wherein the back barrier layer is a residual back barrier layer formed by removing part of a complete back barrier layer positioned on the patterned dielectric layer.

5. The semiconductor device of claim 1, wherein the back barrier layer is formed by one or more materials selected from a group consisting of the following:
- an aluminum gallium nitride alloyed layer with aluminum composition from 1 to 100%;
- an indium gallium aluminum nitride alloyed layer with Iridium composition from 1 to 100%;
- a boron gallium nitride alloyed layer with Boron composition from 1 to 100%; and
- a scandium gallium aluminum nitride alloyed layer with Scandium composition from 1 to 100%.

6. The semiconductor device of claim 1, further comprising:
- a channel layer positioned on the hack barrier layer;
- a barrier layer positioned on the channel layer; and
- an activation layer positioned over the barrier layer.

7. The semiconductor device of claim 6, further comprising at least one of the following:
- the channel layer being formed of one or more materials selected from the group consisting of GaN, InGaN, and AlGaN; and
- the barrier layer being formed of one or more materials selected from the group consisting of AlGaN, InGaN, and ScAIN.

8. The semiconductor device of claim 6, wherein the patterned thermoconductive layer is with a distance of 5 to 1000 nanometers from the interface between the channel layer and the barrier layer.

9. The semiconductor device of claim 1, wherein the patterned thermoconductive layer has the same pattern as the patterned seedling layer.

* * * * *